United States Patent
Honarparvar et al.

(10) Patent No.: US 12,308,854 B2
(45) Date of Patent: May 20, 2025

(54) DIGITALLY ENHANCED DIGITAL-TO-ANALOG CONVERTER RESOLUTION

(71) Applicant: Ciena Corporation, Hanover, MD (US)

(72) Inventors: Mohammad Honarparvar, Gatineau (CA); Sadok Aouini, Gatineau (CA); Jerry Yee-Tung Lam, Stittsville (CA); Soheyl Ziabakhsh Shalmani, Kanata (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 219 days.

(21) Appl. No.: 18/031,188

(22) PCT Filed: Oct. 29, 2021

(86) PCT No.: PCT/US2021/057349
§ 371 (c)(1),
(2) Date: Apr. 11, 2023

(87) PCT Pub. No.: WO2022/094272
PCT Pub. Date: May 5, 2022

(65) Prior Publication Data
US 2023/0412187 A1    Dec. 21, 2023

Related U.S. Application Data

(63) Continuation of application No. 17/085,520, filed on Oct. 30, 2020, now Pat. No. 11,171,664.

(51) Int. Cl.
*H03M 1/66* (2006.01)
*H03M 1/06* (2006.01)
(Continued)

(52) U.S. Cl.
CPC ......... *H03M 1/661* (2013.01); *H03M 1/0607* (2013.01); *H03M 1/0682* (2013.01);
(Continued)

(58) Field of Classification Search
CPC .. H03M 1/661; H03M 1/0607; H03M 1/0682; H03M 1/20; H03M 1/742; H03M 1/68
(Continued)

(56) References Cited

U.S. PATENT DOCUMENTS 6,961,013 B2 * 11/2005 Lin ..................... H03M 1/0641
341/145
9,843,336 B1 * 12/2017 Chao ..................... H03M 1/662
(Continued)

*Primary Examiner* — Khai M Nguyen
(74) *Attorney, Agent, or Firm* — Young Basile Hanlon & MacFarlane, P.C.

(57) ABSTRACT

Described herein are apparatus and methods for digitally enhancing digital-to-analog converter (DAC) resolution. A digitally enhanced DAC includes a decoder circuit configured to convert a N-bit input data to at least N code bits, a digital enhancement circuit configured to logically operate on a least significant bit (LSB) of the N-bit data, and a switching network including at least N DAC unit elements, where a least significant DAC unit element is controlled by the digital enhancement circuit to output a factored nominal current or voltage when a logical operation outputs a defined logic level for the LSB and to output a nominal current or voltage absent output of the defined logic level and a remaining DAC unit elements are controlled by a remaining code bits of the at least N code bits. This provides a N+1 bit resolution for the DAC without increasing the at least N DAC unit elements.

20 Claims, 16 Drawing Sheets

(51) Int. Cl.
*H03M 1/20* (2006.01)
*H03M 1/68* (2006.01)
*H03M 1/74* (2006.01)

(52) U.S. Cl.
CPC ............... *H03M 1/20* (2013.01); *H03M 1/68* (2013.01); *H03M 1/742* (2013.01)

(58) Field of Classification Search
USPC ........................................................ 341/144
See application file for complete search history.

(56) References Cited

U.S. PATENT DOCUMENTS

2003/0201924 A1* 10/2003 Lakshmikumar ..... H03M 1/687
341/153
2004/0104832 A1 6/2004 Bugeja

* cited by examiner

Resistor based DAC unit cell

DIGITALLY ENHANCED DIGITAL-TO-ANALOG CONVERTER RESOLUTION

CROSS-REFERENCE TO RELATED APPLICATION(S)

This application is a national stage entry of International Patent Application Serial No. PCT/US2021/057349, filed Oct. 29, 2021, which claims priority to U.S. application Ser. No. 17/085,520, filed Oct. 30, 2020, the entire disclosures of which are incorporated herein.

TECHNICAL FIELD

This disclosure relates to digital-to-analog converters. More specifically, this disclosure relates to increasing a resolution of the digital-to-analog converters with digital logic.

BACKGROUND

One of the key building blocks in mixed-signal (analog/digital) controlled systems are digital-to-analog converters (DACs). DACs are widely used to maximize flexibility and programmability of different analog circuits such as voltage-controlled oscillators (VCOs), low-drop out regulators (LDOs), phase rotators, and the like. Non-ideal effects of the DACs on the performance of the rest of the system should be minimized. Important factors to consider in the design of calibration circuits are the chip area and power. The complexity and area efficiency of such calibration circuits determines its usefulness and effectiveness.

A DAC architecture includes a digital input coding section and a switching network. The digital input coding section can use different coding techniques or circuits including binary, thermometer code, gray code, and the like to drive the input of the DAC. The simplest and most straightforward way for implementation is using a binary weighed code. However, such a DAC is not guaranteed to be monotonic because of potential mismatches. On the other hand, achieving a high-resolution DAC is quite hard. Moreover, in the case of a voltage mode DAC, the output impedance changes with the input code. One way to mitigate the drawbacks of the binary weighted DACs is to use a thermometer code. A thermometer code provides a monotonic implementation with a good differential non-linearity (DNL) performance and also generates smaller glitches. However, the thermometer DACs essentially need a binary to thermometer decoder to decode N-bits to $2^N-1$ bits to control $2^N-1$-unit DAC elements. It is apparent that when the number of bits is more than 8 bits, the thermometer DAC shows itself as an impractical or inefficient solution. For example, for an 8-bit DAC an 8-to-255 binary to thermometer decoder is needed to drive 255 DAC unit elements. Increasing data word length from 8 bits to 9 bits means that a 9-to-511 binary to thermometer decoder is needed. It is still tolerable as this part of the DAC is a digital circuit with a small footprint. When it comes to the analog block i.e. a DAC unit element, however, it is an expensive solution as 511 DAC unit elements are now required. It is predictable how much worse this issue is when the data word length becomes 10-16 bits. Increasing the resolution of the thermometer code-based DAC is very expensive as it will require an increase in the number of analog cells or DAC unit elements.

Consequently, the performance of simple DACs is limited to 8 bits while complex topologies are required to improve the resolution of the DAC. For example, segmented DACs or coarse and fine DACs must be used if a high-resolution DAC is needed. This results in increased power consumption and use of chip area.

SUMMARY

Described herein are apparatus and methods for digitally enhancing digital-to-analog converter (DAC) resolution.

In implementations, a digital-to-analog converter (DAC) includes a decoder circuit configured to convert a N-bit input data to at least N code bits, a digital enhancement circuit connected to the decoder circuit, the digital enhancement circuit configured to logically operate on a least significant bit (LSB) of the N-bit data, and a switching network including at least N DAC unit elements, where a least significant DAC unit element is controlled by the digital enhancement circuit to output a factored nominal current or voltage when a logical operation outputs a defined logic level for the LSB and to output a nominal current or voltage absent output of the defined logic level, and a remaining DAC unit elements are controlled by a remaining code bits of the at least N code bits, and where a N+1 bit resolution is provided for the DAC without an increase in the at least N DAC unit elements.

In implementations, the digital enhancement circuit is configured to logically operate on the LSB and a least significant code bit and to logically operate on the LSB and a complement of the least significant code bit. In implementations, the N+1 bit resolution is provided when the logical operation outputs the defined logic level for the LSB and the least significant code bit and a same defined logic level for the LSB and the complement of the least significant code bit. In implementations, the factored nominal current or voltage is approximately a ½ nominal current or voltage. In implementations, each DAC unit element is a differential circuit and each side of the differential circuit of the least significant DAC unit element is turned on when the logical operation outputs the defined logic level for the LSB. In implementations, the digital enhancement circuit further includes a first logical OR gate configured to operate on the LSB and a least significant code bit, and a second logical OR gate configured to operate on the LSB and a complement of the least significant code bit, where the N+1 bit resolution is provided when the first logical OR gate outputs the defined logic level and the second logical OR gate outputs the defined logic level. In implementations, an output of the first logical OR gate is connected to one side of a differential circuit in the least significant DAC unit element and an output of the second logical OR gate is connected to a remaining side of the differential circuit in the least significant DAC unit element, wherein the N+1 bit resolution is provided when the one side of a differential circuit and the remaining side of the differential circuit in the least significant DAC unit element are turned on.

In implementations, a digital-to-analog converter (DAC) includes a digital coding section configured to convert a N-bit input data to at least N code bits, a digital control circuit connected to the digital coding section, the digital coding section configured to logically operate on a least significant bit (LSB) of the N-bit data, and an analog core including at least N DAC unit cells, where a least significant DAC unit cell is controlled by the digital control circuit to output less than a unit current or voltage when the LSB is a logic high and to output a unit current or voltage when the LSB is a logic low, and a remaining DAC unit cells are controlled by a remaining code bits of the at least N code bits, and where a N+1 bit resolution is provided for the DAC without increasing an area of the analog core.

In implementations, the digital control circuit is configured to logically operate on the LSB and a least significant code bit and to logically operate on the LSB and a complement of the least significant code bit. In implementations, the N+1 bit resolution is provided when the logical operation outputs a logic level high for the LSB and the least significant code bit and outputs a logic high for the LSB and the complement of the least significant code bit. In implementations, the reduced unit current or voltage is approximately a ½ nominal current or voltage. In implementations, each DAC unit cell is a differential circuit and each side of the differential circuit of the least significant DAC unit cell is turned on when the LSB is a logic high. In implementations, the digital control circuit further includes a first logical OR gate configured to operate on the LSB and a least significant code bit and a second logical OR gate configured to operate on the LSB and a complement of the least significant code bit, where the N+1 bit resolution is provided when the first logical OR gate outputs a logic high and the second logical OR gate outputs a logic high. In implementations, an output of the first logical OR gate is connected to one side of a differential circuit in the least significant DAC unit cell and an output of the second logical OR gate is connected to a remaining side of the differential circuit in the least significant DAC unit cell, where the N+1 bit resolution is provided when the one side of a differential circuit and the remaining side of the differential circuit in the least significant DAC unit element are turned on.

In implementations, a method for digitally enhancing digital-to-analog converter (DAC) resolution includes decoding a N-bit data input into at least N code bits for a N-bit DAC having at least N DAC unit elements, logically operating on a least significant bit (LSB) of the N-bit data input, and providing a N+1 bit resolution for the N-bit DAC without increasing a quantitative number of the at least N DAC unit elements by generating a reduced current or voltage for a least significant DAC unit element when a logical operation outputs a defined logic level, where a remaining DAC unit elements generate a full current or voltage as controlled by a remaining code bits.

In implementations, the logically operating operates on the LSB and a least significant code bit, and on the LSB and a complement of the least significant code bit. In implementations, the providing provides the N+1 bit resolution when the logical operation outputs the defined logic level for the LSB and the least significant code bit and outputs a same defined logic level for the LSB and the complement of the least significant code bit. In implementations, each DAC unit element includes a differential circuit, the method further includes enabling both sides of the differential circuit in a least significant DAC unit element using a logical operation output of the LSB and the least significant code bit and a logical operation output of the LSB and the complement of the least significant code bit. In implementations, the logically operating further includes logically ORing the LSB and a least significant code bit to generate a first logical output, logically ORing the LSB and a complement of the least significant code bit to generate a second logical output, enabling one side of a differential circuit in the least significant DAC unit element when the first logical output is the defined logic level, and enabling another side of the differential circuit in the least significant DAC unit element when the second logical output is the defined logic level. In implementations, the reduced unit current or voltage is approximately a ½ full current or voltage.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
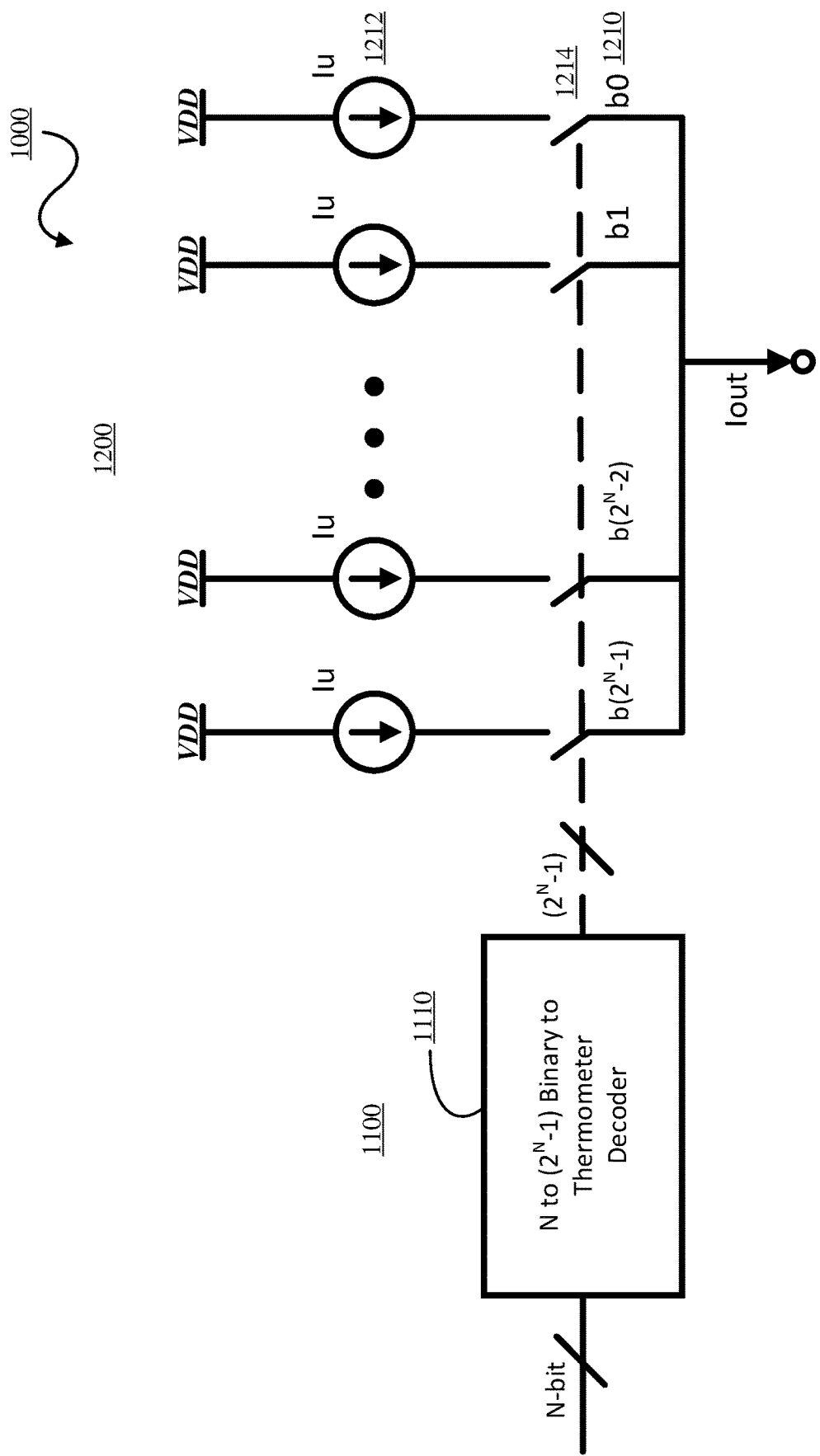
FIG. 1 is a block diagram of a N-bit digital-to-analog converter (DAC) with $2^N-1$ DAC unit elements.

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

Described herein are apparatus, devices, circuits, systems, and methods for a digitally enhanced digital-to-analog converter (DAC). In implementations, the digitally enhanced digital-to-analog converter DAC includes a digital enhancement circuit to effectively increase the resolution of a N-bit DAC to a N+1 bit DAC without adding to the analog core of the DAC. In implementations, a N-bit DAC can include N or more DAC unit elements depending on a type of decoder used in a digital input coding section of the DAC. The digital enhancement circuit increases the resolution of the N-bit DAC to a N+1 DAC without increasing the N or more DAC unit elements (referred to herein as the "analog core") in a switching network of the DAC. The digital enhancement circuit is a digital logic circuit which uses a least significant bit (LSB) of the input data to enable both sides of a DAC unit element to output a current or voltage equal to a difference between the two sides of the DAC unit element.

In implementations, the digital enhancement circuit encodes the LSB of the input with a first code bit from the decoder and a complementary first bit code to generate a new code. The new code switches on both lines of an associated differential DAC unit element in a N-bit DAC which increases the number of steps in the N-bit DAC. Equivalently, the step size is reduced as described herein. Consequently, a resolution of a N+1 bit DAC can be provided using the N-bit DAC without increasing the size of the analog core. Moreover, the digital enhancement circuit does not substantially impact the layout of the N-bit DAC. An input of the digital enhancement circuit connects to the LSB of the input data and an output is connected to the first or least significant code bit DAC unit element instead of the decoder being directly connected to the first or least significant code bit DAC unit element.

In implementations, a value of the LSB of the input data is used directly to generate the extra code bit via the digital logic circuit. That is, the value of the LSB is not manipulated but used as is to generate the extra code bit. As a result, minimal logic hardware is added to the footprint of the DAC. For example, the digital logic circuit can be implemented using two logic OR gates. The area needed by the two logic OR gates is multiple orders of magnitude smaller than the N-bit DAC prior to inclusion of the digital logic circuit. For example, a rough order of magnitude difference between the N-bit DAC and the digital logic circuit is approximately 1000 to 1. Consequently, the addition of the digital logic circuit is de minimis or negligible.

In implementations, provisioning or inclusion of the digital enhancement circuit can reduce the amount of area required by a DAC to implement a one bit increase in resolution. For example, in the case of binary-to-thermometer DAC, the chip area consumed can be reduced by one-half. In the case of coarse and fine DACs, the reduction in chip area is one-quarter. The reduction in chip area is due to the decrease in the number of analog cells needed to implement the digitally enhanced DAC. The digitally enhanced DAC is applicable to a wide range of DAC architectures, applications, or devices such as, but not limited to, resistor-to-resistor (R2R) or resistor ladder DACs, coarse and fine DACs, a segmented DAC, current steering DAC, switched capacitor-based DACs, and the like. The digitally enhanced DAC is applicable to any and all differential configurations, architectures, or platform including complementary metal-oxide-semiconductor (CMOS), bipolar, bi-CMOS, fin field-effect transistors (FinFETs), Fully Depleted Silicon On Insulator (FD-SOI), at board level, and the like.

FIG. 1 is a block diagram of a N-bit digital-to-analog converter (DAC) 1000 with $2^N-1$ DAC unit elements. The N-bit DAC 1000 includes a digital coding section 1100 connected to or in communication with (collectively "connected to") a switching network 1200. The digital coding section 1100 includes a N to $2^N-1$ binary-to-thermometer decoder 1110 which converts or decodes a N-bit input data to $2^N-1$ code bits. The switching network 1200 includes $2^N-1$ DAC unit elements b0, b1, . . ., $b(2^N-1)$ 1210 connected to or controlled by a corresponding code bit from the binary-to-thermometer decoder 1110. Each of the DAC unit elements b0, b1, . . ., $b(2^N-1)$ 1210 is a repetitive current generating circuit or voltage producing circuit. In this instance, each of the DAC unit elements b0, b1, . . ., $b(2^N-1)$ 1210 includes a current source 1212 connected to $V_{DD}$ and a switch 1214. Each of the DAC unit elements b0, b1, . . ., $b(2^N-1)$ 1210 generates a unit current $I_U$, which contributes to an output current $I_{OUT}$ when the switch 1214 is in a closed position. The resolution of the N-bit DAC 1000 is dependent on the number of DAC unit elements b0, b1, . . ., $b(2^N-1)$ 1210 as controlled by the $2^N-1$ code bits.

Figure 2:
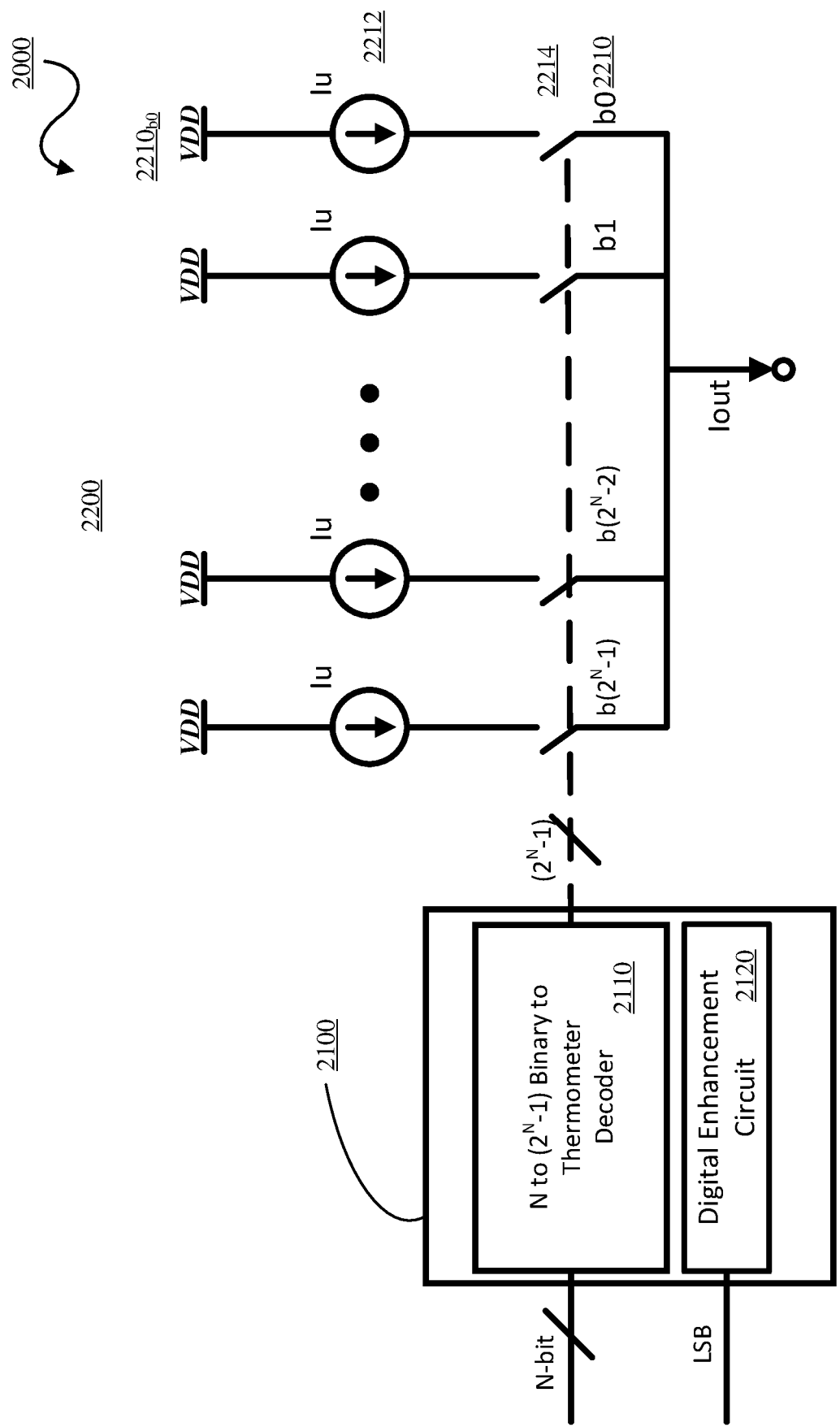
FIG. 2 is a block diagram of an example N+1 bit DAC with $2^N-1$ DAC unit elements and a digital enhancement circuit in accordance with embodiments of this disclosure.

FIG. 2 is a block diagram of an example N+1 bit DAC 2000 with $2^N-1$ DAC unit elements and a digital enhancement circuit in accordance with embodiments of this disclosure. The N-bit DAC 2000 includes a digital coding section 2100 connected to a switching network 2200. The digital coding section 2100 includes a N to $2^N-1$ binary-to-thermometer decoder 2110 and a digital enhancement circuit 2120. The N to $2^N-1$ binary-to-thermometer decoder 2110 converts or decodes a N-bit input data to $2^N-1$ code bits. The digital enhancement circuit 2120 is a logic circuit which operates on a least significant bit (LSB) of the N-bit input data to generate a digital enhancement code bit.

The switching network 2200 includes $2^N-1$ DAC unit elements b0, b1, . . ., $b(2^N-1)$ 2210 connected to or controlled by a corresponding code bit from the binary-to-thermometer decoder 2110 and the digital enhancement code bit from the digital enhancement circuit 2120. Each of the DAC unit elements b0, b1, . . ., $b(2^N-1)$ 2210 is a repetitive current generating circuit or voltage producing circuit. In implementations, the repetitive current generating circuit or voltage producing circuit is a differential circuit. In this instance, each of the DAC unit elements b0, b1, . . ., $b(2^N-1)$ 2210 includes a current source 2212 connected to $V_{DD}$ and a switch 2214. Each of the DAC unit elements b1, . . ., $b(2^N-1)$ 2210 generates a unit current $I_U$, which contributes to an output current $I_{OUT}$ when the switch 2214 is in a closed position. The resolution of the N-bit DAC 2000 is digitally enhanced using the digital enhancement code bit. In a first logical state, application of the digital enhancement code bit to a b0 DAC unit element 2210$_{b0}$ results in the b0 DAC unit element 2210$_{b0}$ generating a factored $I_U$ (a difference value or half the value of the LSB as described herein). In a second logical state, application of the digital enhancement code bit to b0 DAC unit element 2210$_{b0}$ results in the b0 DAC unit element 2210$_{b0}$ generating $U_I$ similar to the other DAC unit elements. Consequently, an extra bit of resolution is provided. The resolution of the N-bit DAC 2000 is therefore the resolution of a N+1 bit DAC but without any extra DAC unit elements. The resolution is now effectively $2^{N+1}-1$ code bits due to the two control state digital enhancement code bit.

Figure 3:
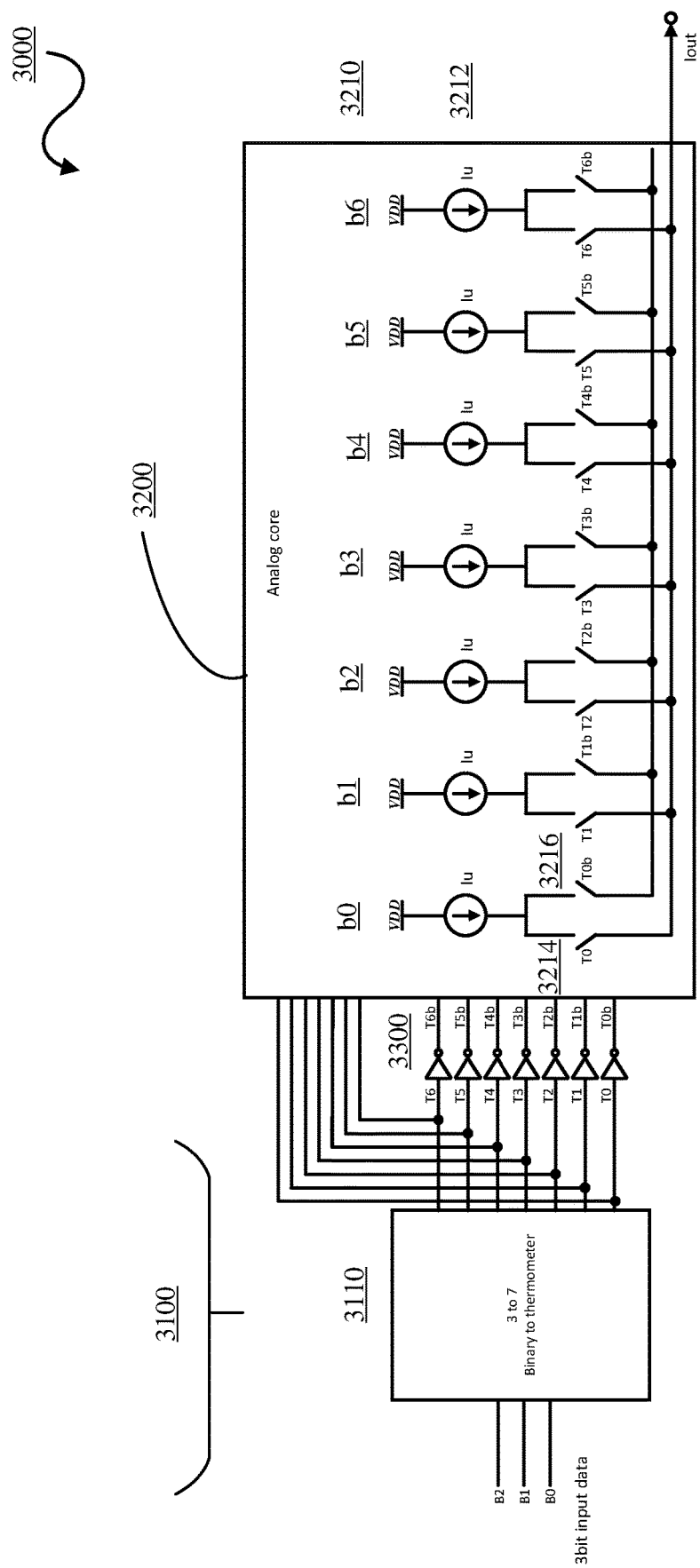
FIG. 3 is a block diagram of a 3-bit DAC with 7 DAC unit elements.

FIG. 3 is a block diagram of a 3-bit DAC 3000 with 7 DAC unit elements. The 3-bit DAC 3000 includes a digital coding section 3100 connected to a switching network 3200 (which can also be referred to as the analog core of the 3-bit DAC 3000). The digital coding section 3100 includes a 3 to 7 binary-to-thermometer decoder 3110 which converts or decodes a 3-bit input data to 7 code bits. The 7 code bits and 7 complementary code bits (generated via inverters 3300) are connected to the switching network 3200.

The switching network 3200 includes 7 DAC unit elements b0, b1, . . ., b7 3210 connected to or controlled by a corresponding code bit from the binary-to-thermometer decoder 3110. Each of the DAC unit elements b0, b1, . . ., b7 3210 is a repetitive current generating circuit or voltage producing circuit. In this instance, each of the DAC unit elements b0, b1, . . ., b7 includes a current source 3212 connected to $V_{DD}$ and a pair of differential switches 3214 and 3216. Each of the DAC unit elements b0, b1, . . ., b7 3210 generates a unit current $I_U$, which contributes to an output current $I_{OUT}$ when one of the differential switches 3214 or 3216 is in a closed position or is on. The resolution of the 3-bit DAC 3000 is dependent on the 7 code bits.

Figure 4:
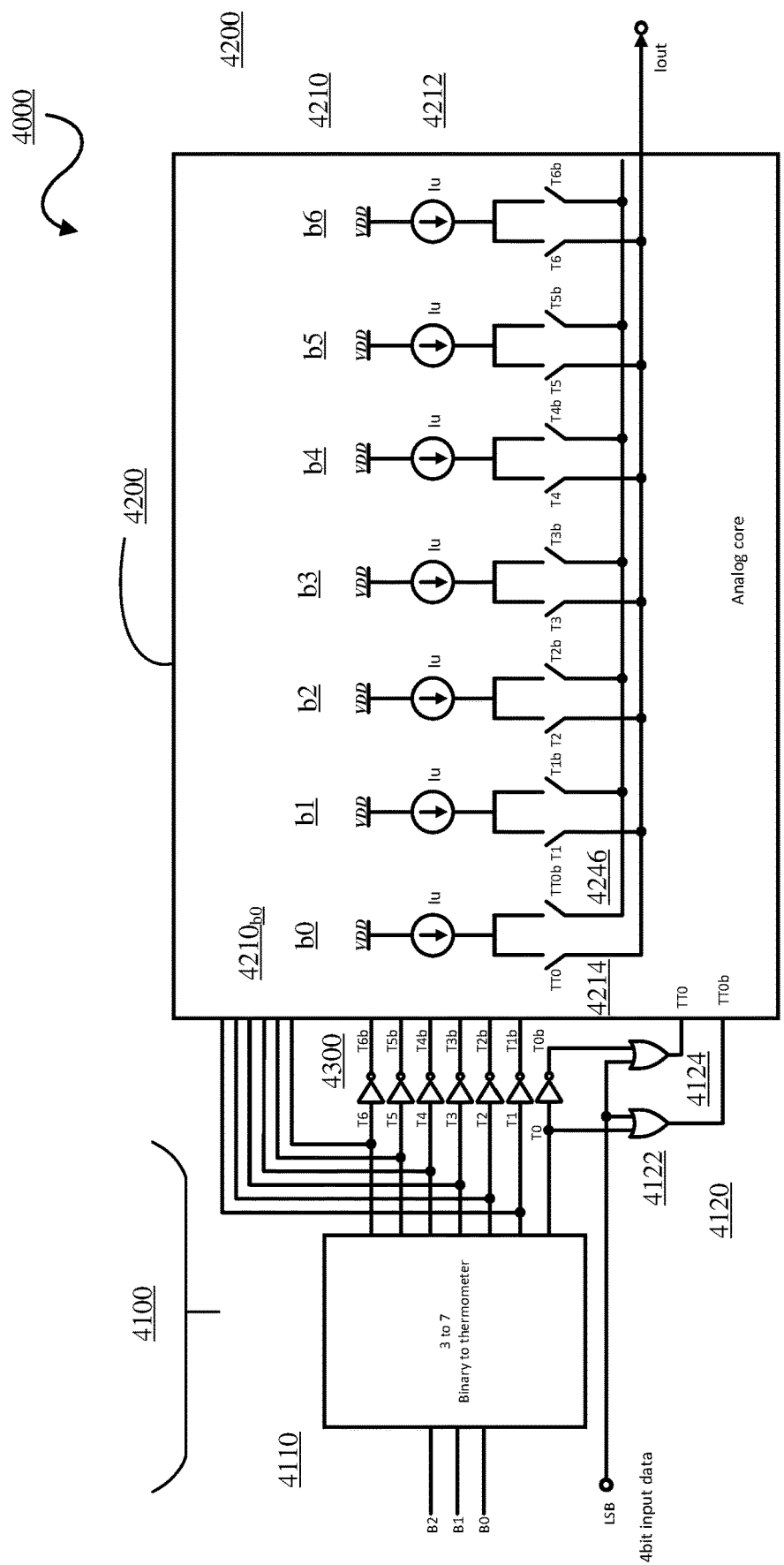
FIG. 4 is a block diagram of an example 4-bit DAC with 7 DAC unit elements and a digital enhancement circuit in accordance with embodiments of this disclosure.

FIG. 4 is a block diagram of an example 4 bit DAC 4000 with 7 DAC unit elements and a digital enhancement circuit in accordance with embodiments of this disclosure. The 4-bit DAC 4000 includes a digital coding section 4100 connected to a switching network 4200. The digital coding section 4100 includes a 3 to 7 binary-to-thermometer decoder 4110 and a digital enhancement circuit 4120. The 3 to 7 binary-to-thermometer decoder 4110 converts or decodes a 3-bit input data to 7 code bits. The 7 code bits are connected to inverters 4300 to generate 7 complementary code bits. The 6 higher or most significant bits are connected to the switching network 4200.

The digital enhancement circuit 4120 is a logic circuit which operates on a least significant bit (LSB) of the 3-bit input data to generate a digital enhancement code bit to effectively create a 4-bit DAC. In implementations, the digital enhancement circuit 4120 includes a pair of logic OR gates 4122 and 4124. The inputs of the logic OR gate 4122 are connected to the LSB of the 3-bit input data and the first or least significant code bit T0. The inputs of the logic OR gate 4124 are connected to the LSB of the 3-bit input data and the complementary first or least significant code bit T0b. The output of the logic OR gates 4122 and 4124 are connected to the switching network 4200 as described herein. In implementations, different logic gates can be used without departing from the scope of the specification and the claims.

The switching network 4200 includes 7 DAC unit elements b0, b1, . . ., b7 4210 connected to or controlled by a corresponding code bit from the binary-to-thermometer decoder 4110 and the digital enhancement code bit from the digital enhancement circuit 4120. Each of the DAC unit elements b0, b1, . . ., b7 4210 is a repetitive current generating circuit or voltage producing circuit. In this instance, each of the DAC unit elements b0, b1, . . ., b7 4210 includes a current source 4212 connected to $V_{DD}$ and a pair of differential switches 4214 and 4216. Each of the DAC unit elements b1, . . ., b7 4210 generates a unit current $I_U$, which contributes to an output current $I_{OUT}$ when one of the differential switches 4214 or 4216 is in a closed position or is on. In implementations, the output of the logic OR gates 4122 and 4124 are connected to the pair of differential switches associated with a b0 DAC unit element $4210_{b0}$. The output of the logic OR gate 4122 is connected to a TT0b switch $4216_{TT0b}$ and the logic OR gate 4124 is connected to a TT0 switch $4214_{TT0}$.

The resolution of the 4-bit DAC 4000 is digitally enhanced using the digital enhancement code bit. In implementations, when the output of the logic OR gates 4122 and 4124 are high, the pair of differential switches, TT0b switch $4216_{TT0b}$ and TT0 switch $4214_{TT0}$, are on and the b0 DAC unit element $4210_{b0}$ generates half of the current represented by the LSB or a factored or difference $I_U$. That is, when the LSB of the 3-bit input data is high, a non-$I_U$ value is generated by the b0 DAC unit element $4210_{b0}$. When the output of the logic OR gates 4122 and 4124 is not high, one of the pair of differential switches, TT0b switch $4216_{TT0b}$ and TT0 switch $4214_{TT0}$, is on and the b0 DAC unit element $4210_{b0}$ generates $I_U$. Consequently, an extra bit of resolution is provided by turning on both of the differential switches as opposed to turning on one of the differential switches. The resolution of the 4-bit DAC 4000 is provided with the number of DAC unit elements equivalent to a 3-bit DAC. In implementations, the logic state of high is illustrative and a low logic state can be implemented without departing from the scope of the specification and the claims.

Figure 5:
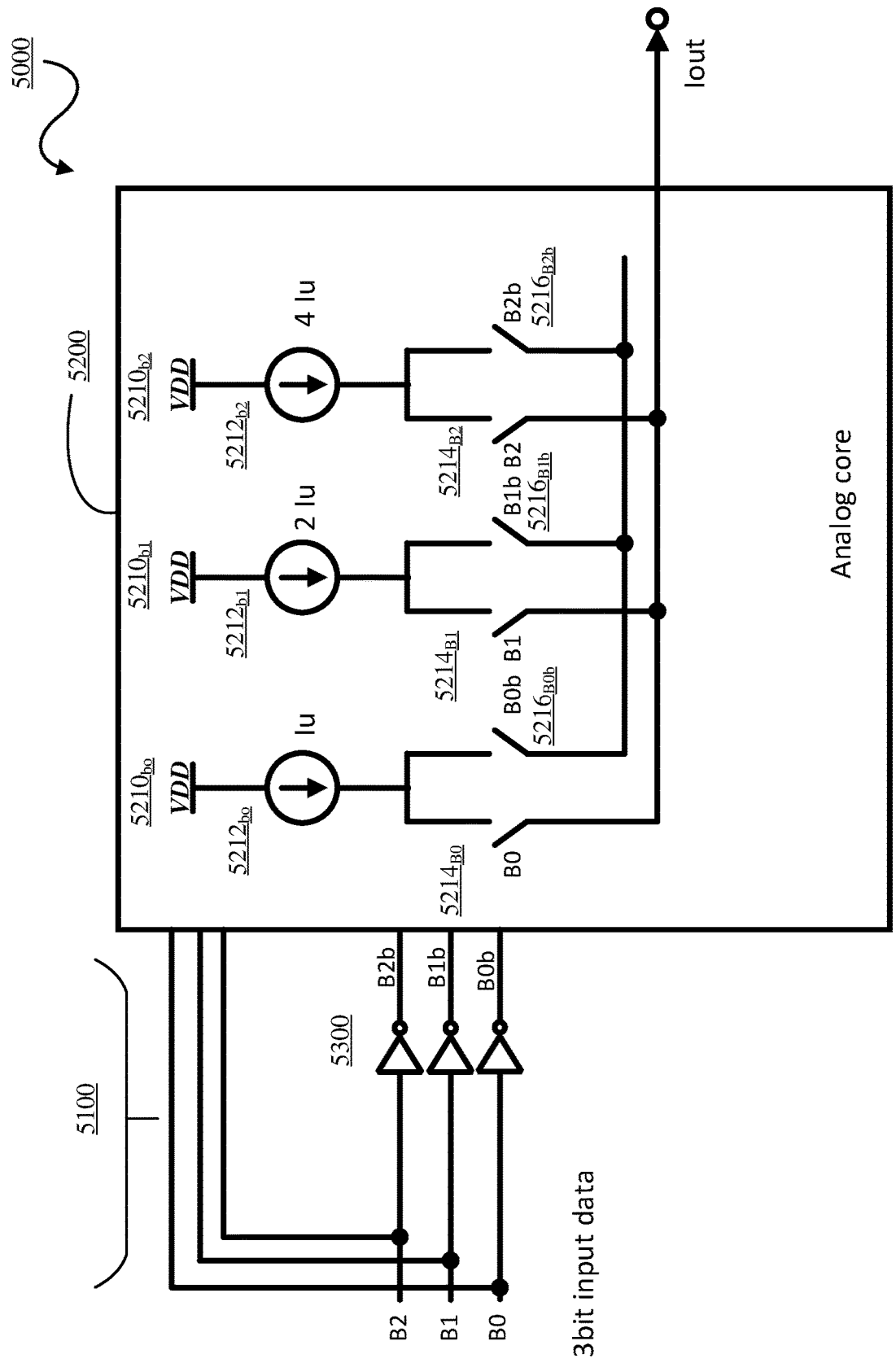
FIG. 5 is a block diagram of a 3-bit binary weighted DAC with 3 DAC unit elements.

FIG. 5 is a block diagram of a 3-bit binary weighted DAC 5000 with 3 binary weighted current sources. The 3-bit DAC 5000 includes a digital coding section 5100 connected to a switching network 5200 (which can also be referred to as the analog core of the 3-bit DAC 5000). The digital coding section 5100 decodes a 3-bit input data to 3 code bits. The 3 code bits and 3 complementary code bits (generated via inverters 5300) are connected to the switching network 5200.

The switching network 5200 includes 3 binary weighted current sources b0 $5210_{b0}$, b1 $5210_{b1}$, and b2 $5210_{b2}$ connected to or controlled by a corresponding code bit. Each of the binary weighted current sources b0 $5210_{b0}$, b1 $5210_{b1}$, and b2 $5210_{b2}$ is a repetitive current generating circuit or voltage producing circuit. In this instance, each of the binary weighted current sources b0, b1, and b2 includes a current source 5212 b0, 5212 b1, and 5212 b2, respectively, connected to $V_{DD}$ and a pair of differential switches $5214_{B0}$ and $5216_{B0b}$, $5214_{B1}$ and $5216_{B1b}$, and $5214_{B2}$ and $5216_{B2b}$, respectively. Each of the binary weighted current sources b0 $5210_{b0}$, b1 $5210_{b1}$, and b2 $5210_{b2}$ generates a weighted unit current $I_U$, $2I_U$, and $4I_U$, respectively, which contributes to an output current $I_{OUT}$ when one of the differential switches $5214_{B0}$ and $5216_{B0b}$, $5214_{B1}$ and $5216_{B1b}$, and $5214_{B2}$ and $5216_{B2b}$, respectively, is in a closed position or is on.

Figure 6:
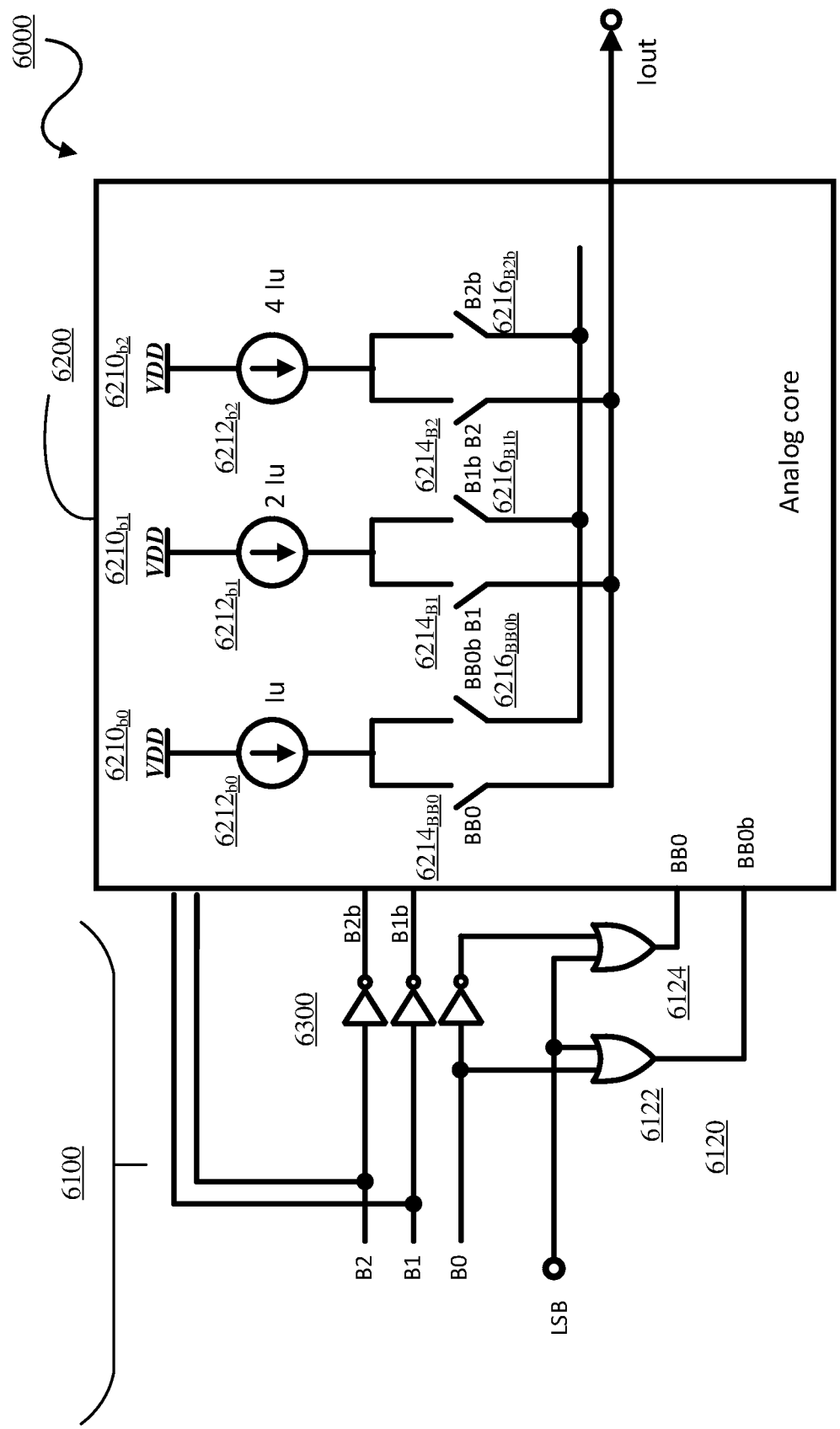
FIG. 6 is a block diagram of an example 4-bit binary weighted DAC with 3 DAC unit elements and a digital enhancement circuit in accordance with embodiments of this disclosure.

FIG. 6 is a block diagram of an example 3-bit binary weighted DAC 6000 with 3 binary weighted current sources and a digital enhancement circuit in accordance with embodiments of this disclosure. The 3-bit binary weighted DAC 6000 includes a digital coding section 6100 connected to a switching network 6200. The digital coding section 6100 decodes a 3-bit input data to 3 code bits and includes a digital enhancement circuit 6120. The 3 code bits are connected to inverters 6300 to generate 3 complementary code bits. The 2 higher or most significant bits are connected to the switching network 6200.

The digital enhancement circuit 6120 is a logic circuit which operates on a least significant bit (LSB) of the 3-bit input data to generate a digital enhancement code bit to effectively create a 4-bit binary weighted DAC. In implementations, the digital enhancement circuit 6120 includes a pair of logic OR gates 6122 and 6124. The inputs of the logic OR gate 6122 are connected to the LSB of the 3-bit input data and the first or least significant code bit B0. The inputs of the logic OR gate 6124 are connected to the LSB of the 3-bit input data and the complementary first or least significant code bit B0b. The output of the logic OR gates 6122 and 6124 are connected to the switching network 6200 as described herein. In implementations, different logic gates can be used without departing from the scope of the specification and the claims.

The switching network 6200 includes 3 binary weighted current sources b0 $6210_{b0}$, b1 $6210_{b1}$, and b2 $6210_{b2}$ connected to or controlled by a corresponding code bit and the digital enhancement code bit. Each of the binary weighted current sources b0 $6210_{b0}$, b1 $6210_{b1}$, and b2 $6210_{b2}$ is a repetitive current generating circuit or voltage producing circuit. In this instance, each of the binary weighted current sources b0 $6210_{b0}$, b1 $6210_{b1}$, and b2 $6210_{b2}$ include a current source 6212 b0, 6212 b1, and 6212 b2, respectively, connected to $V_{DD}$ and a pair of differential switches $6214_{BB0}$ and $6216_{BB0b}$, $6214_{B1}$ and $6216_{B1b}$, and $6214_{B2}$ and $6216_{B2b}$, respectively. The binary weighted current sources b1 $6210_{b1}$, and b2 $6210_{b2}$ generate a weighted unit current $2I_U$, and $4I_U$, respectively, which contributes to an output current $I_{OUT}$ when one of the differential switches $6214_{B1}$ and $6216_{B1b}$, and $6214_{B2}$ and $6216_{B2b}$, respectively, is in a closed position or is on. In implementations, the output of the logic OR gates 6122 and 6124 are connected to the pair of differential switches associated with binary weighted current source b0 $6210_{b0}$. The output of the logic OR gate 6122 is connected to switch $6216_{BB0b}$ and the logic OR gate 6124 is connected to switch $6214_{BB0}$.

The resolution of the 3-bit binary weighted DAC 6000 is digitally enhanced using the digital enhancement code bit. In implementations, when the output of the logic OR gates 6122 and 6124 are high, the pair of differential switches, $6214_{BB0}$ and $6216_{BB0b}$, are on and the binary weighted current source b0 $6210_{b0}$ generates half of the current represented by the LSB or a factored or difference $I_U$. That is, when the LSB of the 3-bit input data is high, a non-$I_U$ value is generated by the binary weighted current source b0

$6210_{b0}$. When the output of the logic OR gates 6122 and 6124 is not high, one of the pair of differential switches, $6214_{BBO}$ and $6216_{BBOb}$, is on and the binary weighted current source b0 $6210_{b0}$ generates $I_U$. Consequently, an extra bit of resolution is provided by turning on both of the differential switches as opposed to turning on one of the differential switches. The enhanced resolution of the 3-bit binary weighted DAC 6000 is provided with the number of binary weighted current sources equivalent to a conventional 3-bit binary weighted DAC. In implementations, the logic state of high is illustrative and a low logic state can be implemented without departing from the scope of the specification and the claims.

Figure 7:
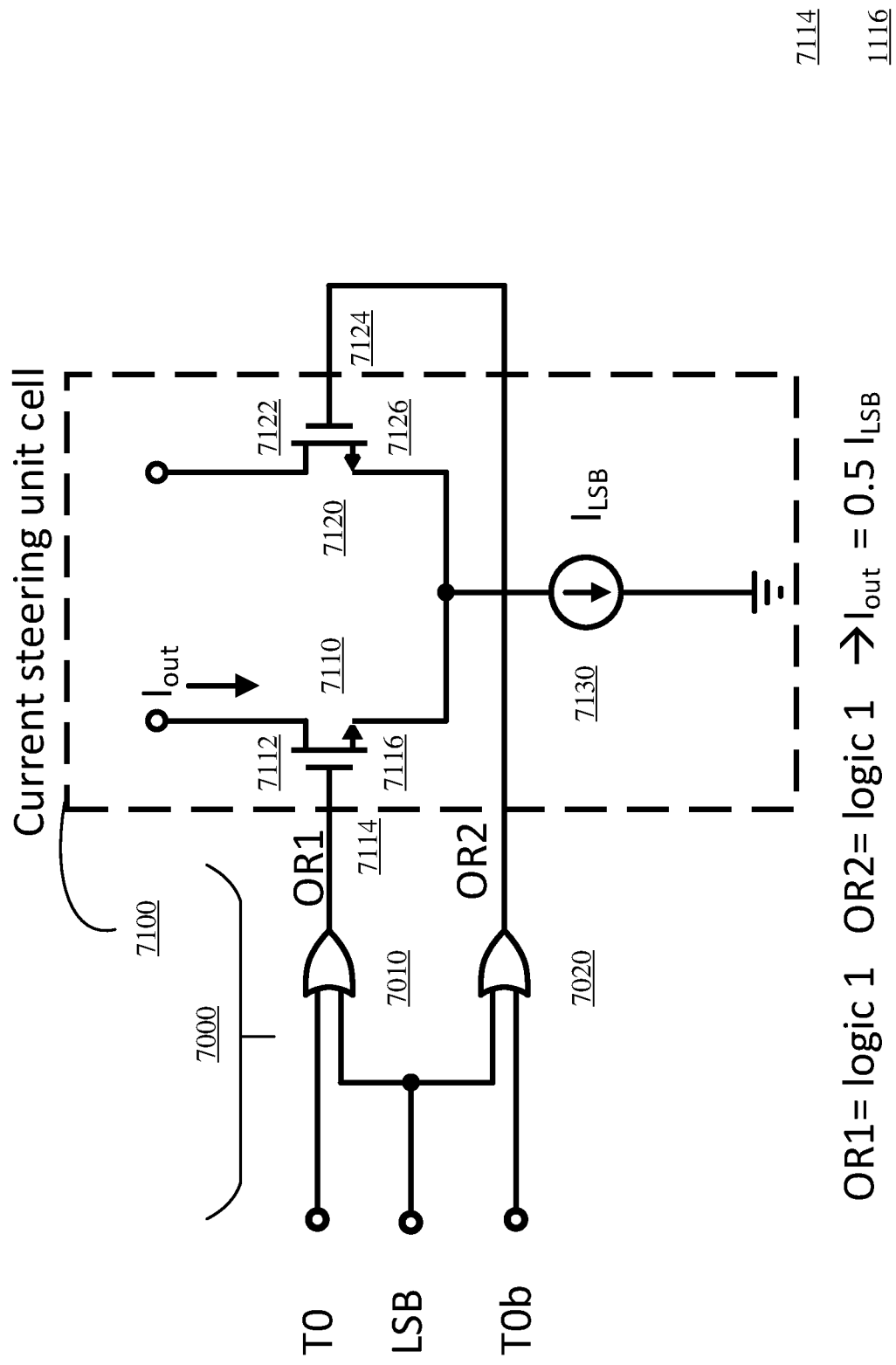
FIG. 7 is a block diagram of a current steering unit cell for use in a digital enhanced DAC in accordance with embodiments of this disclosure.

FIG. 7 is a block diagram of a digital enhancement circuit 7000 connected to a current steering unit cell 7100 for use in a digital enhanced DAC in accordance with embodiments of this disclosure. In implementations, the current steering unit cell 7100 can be used for the DAC unit elements or cells described herein. The current steering unit cell 7100 includes differential pair transistors 7110 and 7120, each having a source 7112 and 7122, a gate 7114 and 7124, and a drain 7116 and 7126. The sources 7112 and 7122 are connected to an output current $I_{OUT}$. The drains 7116 and 7126 are connected to a current source 7130 for providing an LSB current $I_{LSB}$.

The digital enhancement circuit 7000 can include a pair of logic OR gates 7010 and 7020. The inputs of the logic OR gate 7010 are connected to an LSB of a N-bit input data and a first or least significant code bit from a decoder circuit. The inputs of the logic OR gate 7020 are connected to the LSB of the N-bit input data and a complementary of the first or least significant code bit. An output of the logic OR gate 7010 is connected to the gate 7114 and an output of the logic OR gate 7020 is connected to the gate 7124. When the output of the both the logic OR gates 7010 and 7020 are logic 1 or high, then $I_{OUT}=0.5\ I_{LSB}$.

Figure 8:
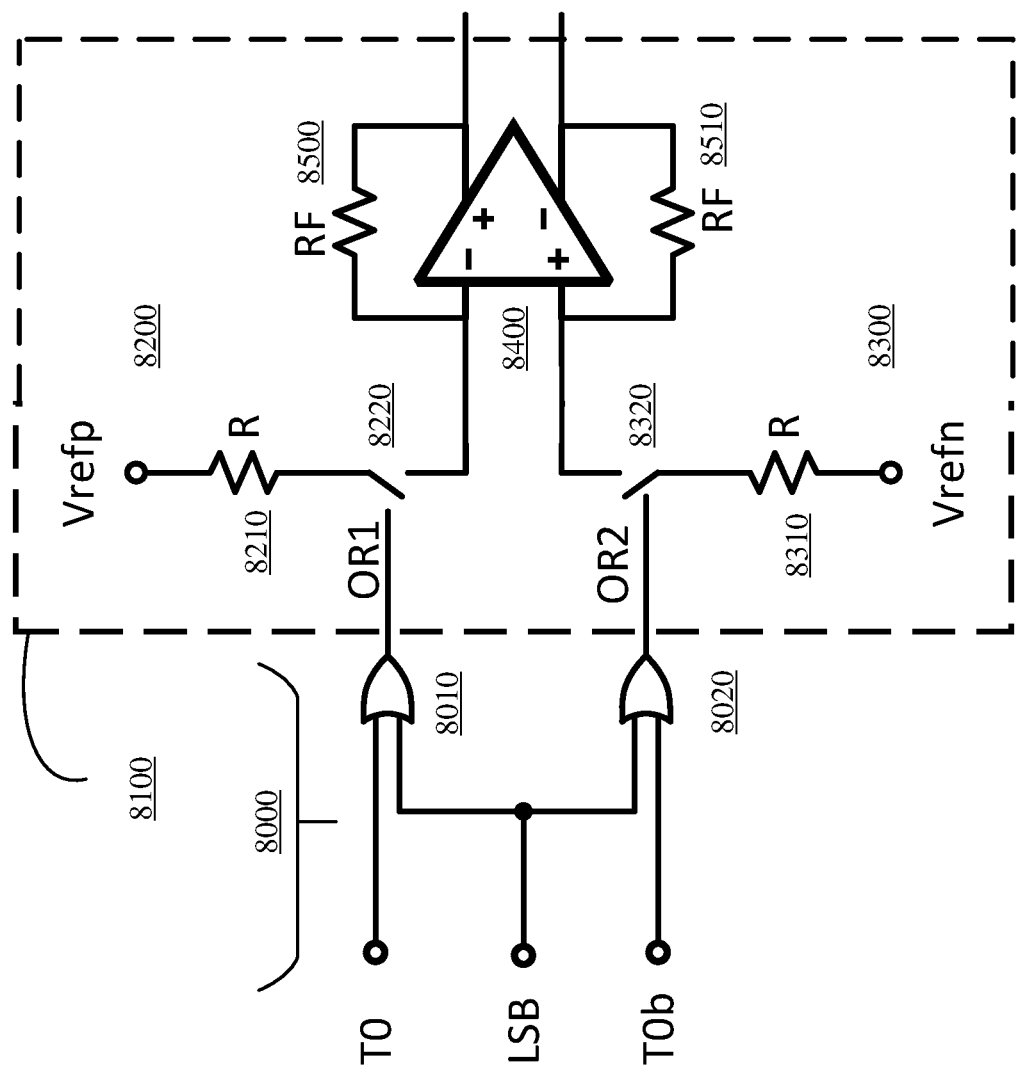
FIG. 8 is a block diagram of a resistor based unit cell for use in a digital enhanced DAC in accordance with embodiments of this disclosure.

FIG. 8 is a block diagram of a digital enhancement circuit 8000 connected to a resistor based DAC unit cell 8100 for use in a digital enhanced DAC in accordance with embodiments of this disclosure. In implementations, the resistor based DAC unit cell 8100 can be used for the DAC unit elements or cells described herein. The resistor based DAC unit cell 8100 includes a first or positive path 8200 and a second or negative path 8300. The first or positive path 8200 is connected to a negative input of a fully differential operational amplifier 8400 and the second or negative path 8300 is connected to a positive input of the fully differential operational amplifier 8400. A feedback resistor (RF) 8500 is connected between the negative input and a positive output of the fully differential operational amplifier 8400 and a RF 8510 is connected between the positive input and a negative output of the fully differential operational amplifier 8400. The first or positive path 8200 includes a resistor 8210 connected to a positive reference voltage ($V_{refp}$) and the negative input of the fully differential operational amplifier 8400 via a switch 8220. The second or negative path 8300 includes a resistor 8310 connected to a negative reference voltage ($V_{refn}$) and the positive input of the fully differential operational amplifier 8400 via a switch 8320.

The digital enhancement circuit 8000 can include a pair of logic OR gates 8010 and 8020. The inputs of the logic OR gate 8010 are connected to an LSB of a N-bit input data and a first or least significant code bit from a decoder circuit. The inputs of the logic OR gate 8020 are connected to the LSB of the N-bit input data and a complementary of the first or least significant code bit. An output of the logic OR gate 8010 is connected to the switch 8320 and an output of the logic OR gate 8020 is connected to the switch 8320. When the output of the both the logic OR gates 8010 and 8020 are logic 1 or high, the switches 8220 and 8320 connect the resistors 8210 and 8310 to the fully differential operational amplifier 8400 to generate an output current which is equal to ½ the LSB current. The output current is multiplied by the feedback resistors 8500 and 8520 to generate the output voltage.

Figure 9:
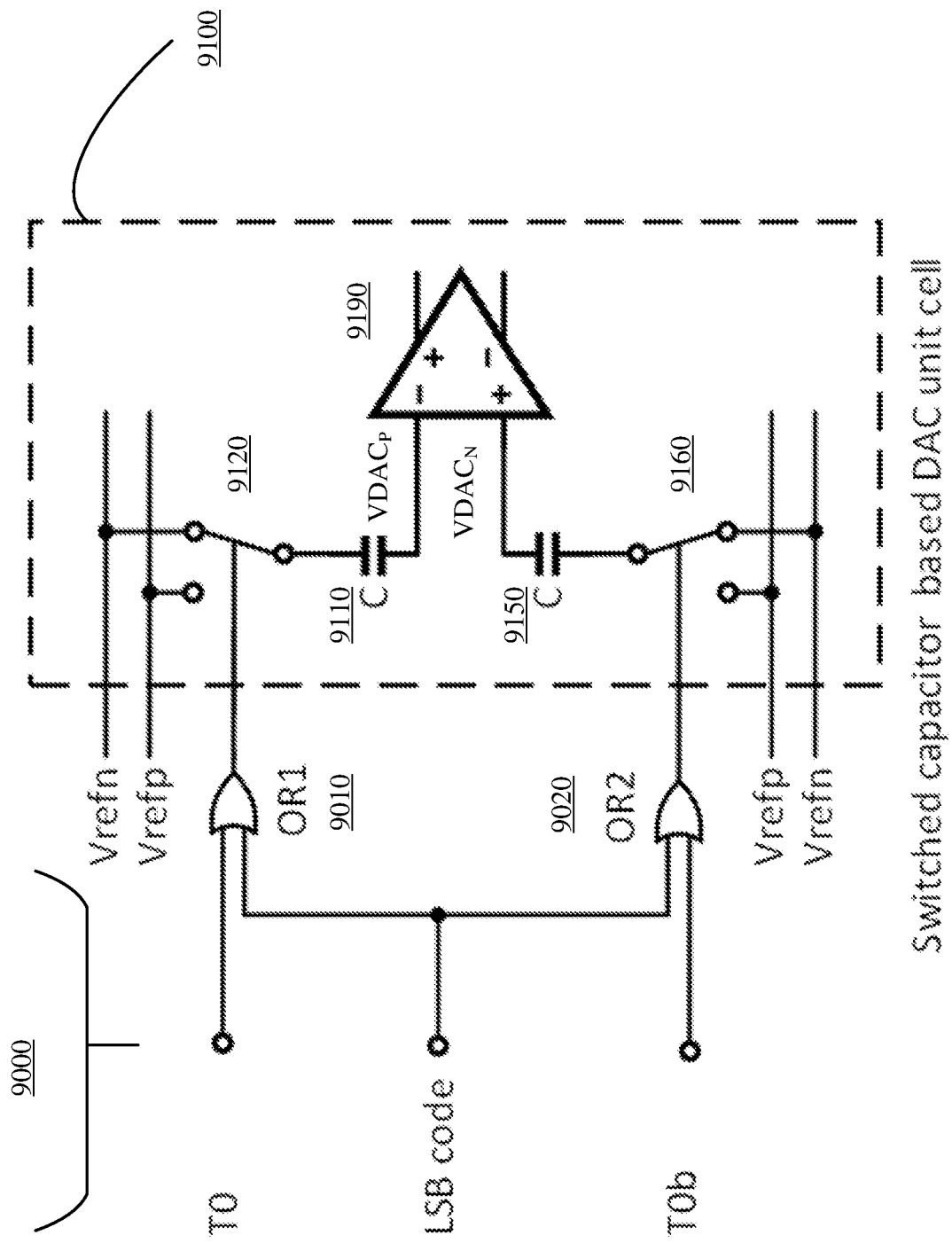
FIG. 9 is a block diagram of a charge-based or switched capacitor based unit cell for use in a digital enhanced DAC in accordance with embodiments of this disclosure.

FIG. 9 is a block diagram of a digital enhancement circuit 9000 connected to a switched capacitor based DAC unit cell 9100 for use in a digital enhanced DAC in accordance with embodiments of this disclosure. In implementations, the switched capacitor based DAC unit cell 9100 can be used for the DAC unit elements or cells described herein. The switched capacitor based DAC unit cell 9100 includes a first capacitor 9110 connected to a negative input of a fully differential operational amplifier 9190 and switchably connected to a positive reference voltage ($V_{refp}$) and a negative reference voltage ($V_{refn}$) via a first switch 9120. The switched capacitor based DAC unit cell 9100 includes a second capacitor 9150 connected to a positive input of the fully differential operational amplifier 9190 and switchably connected to the positive reference voltage ($V_{refp}$) and the negative reference voltage ($V_{refn}$) via a second switch 9160.

The digital enhancement circuit 9000 can include a pair of logic OR gates 9010 and 9020. The inputs of the logic OR gate 9010 are connected to an LSB of a N-bit input data and a first or least significant code bit from a decoder circuit. The inputs of the logic OR gate 9020 are connected to the LSB of the N-bit input data and a complementary of the first or least significant code bit. An output of the logic OR gate 9010 is connected to the first switch 9120 and an output of the logic OR gate 9020 is connected to the second switch 9160. When the output of the both the logic OR gates 9010 and 9020 are logic 1 or high, the output of the fully differential operational amplifier 9190 is ½ $V_{DAC}$.

Figure 10:
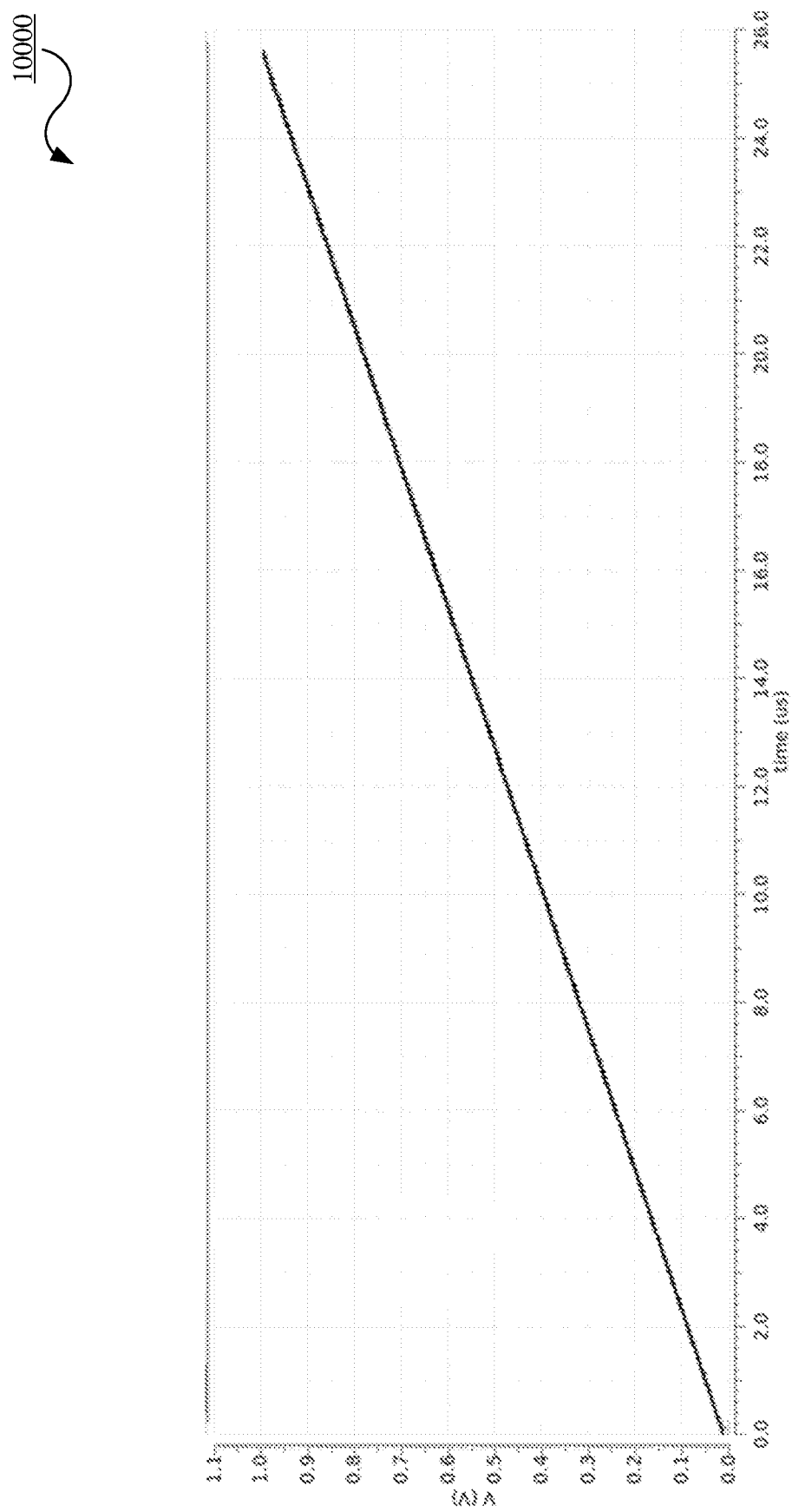
FIG. 10 is a graph of a transfer function of a DAC.
Figure 11:
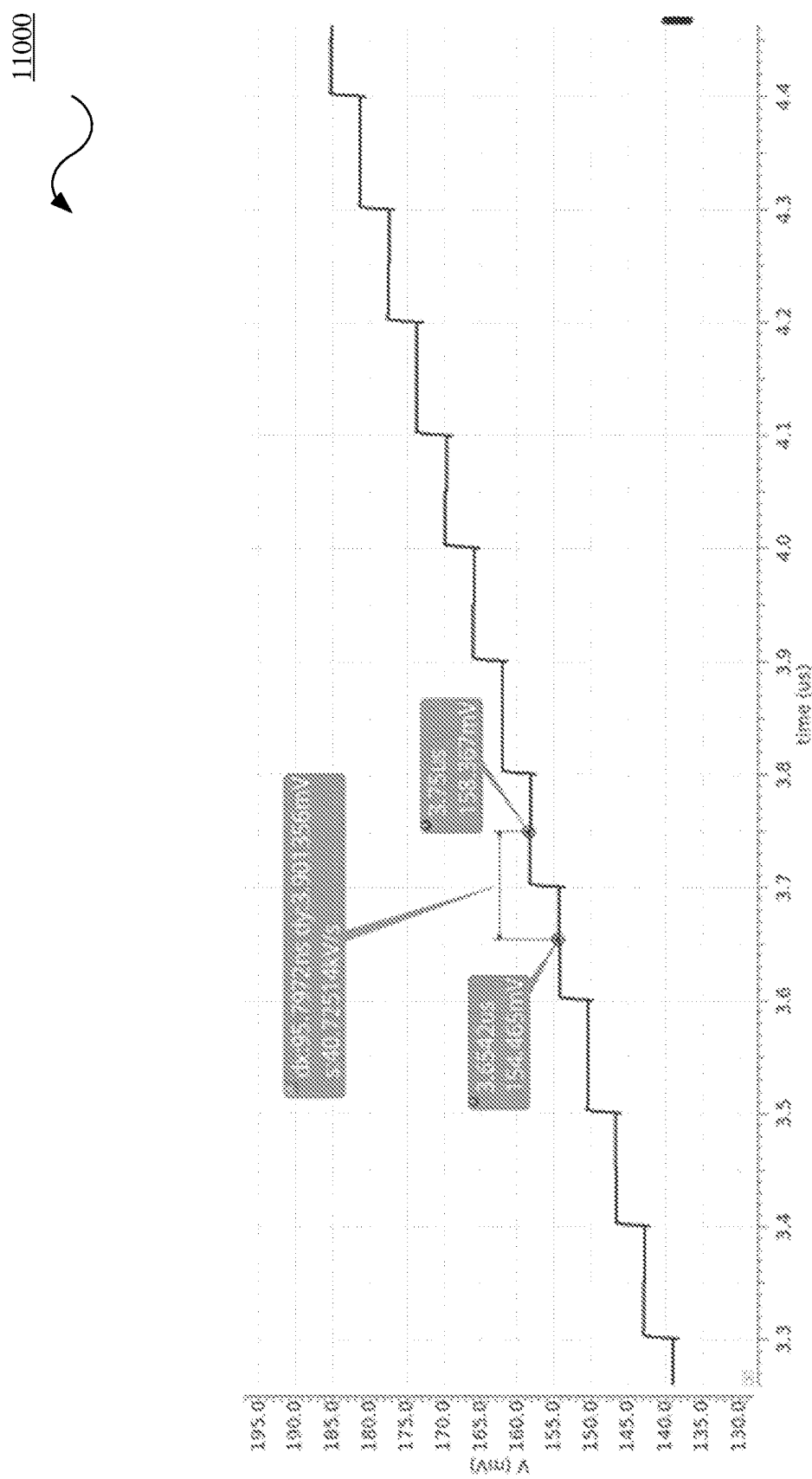
FIG. 11 is a zoomed graph of a transfer function of a DAC.

FIG. 10 is a graph 10000 of a transfer function of a DAC without a digital enhancement circuit. FIG. 11 is a zoomed graph 11000 of a portion of the graph 10000. The zoomed graph 11000 shows that the step size or resolution is approximately 3.901 (the slope).

Figure 12:
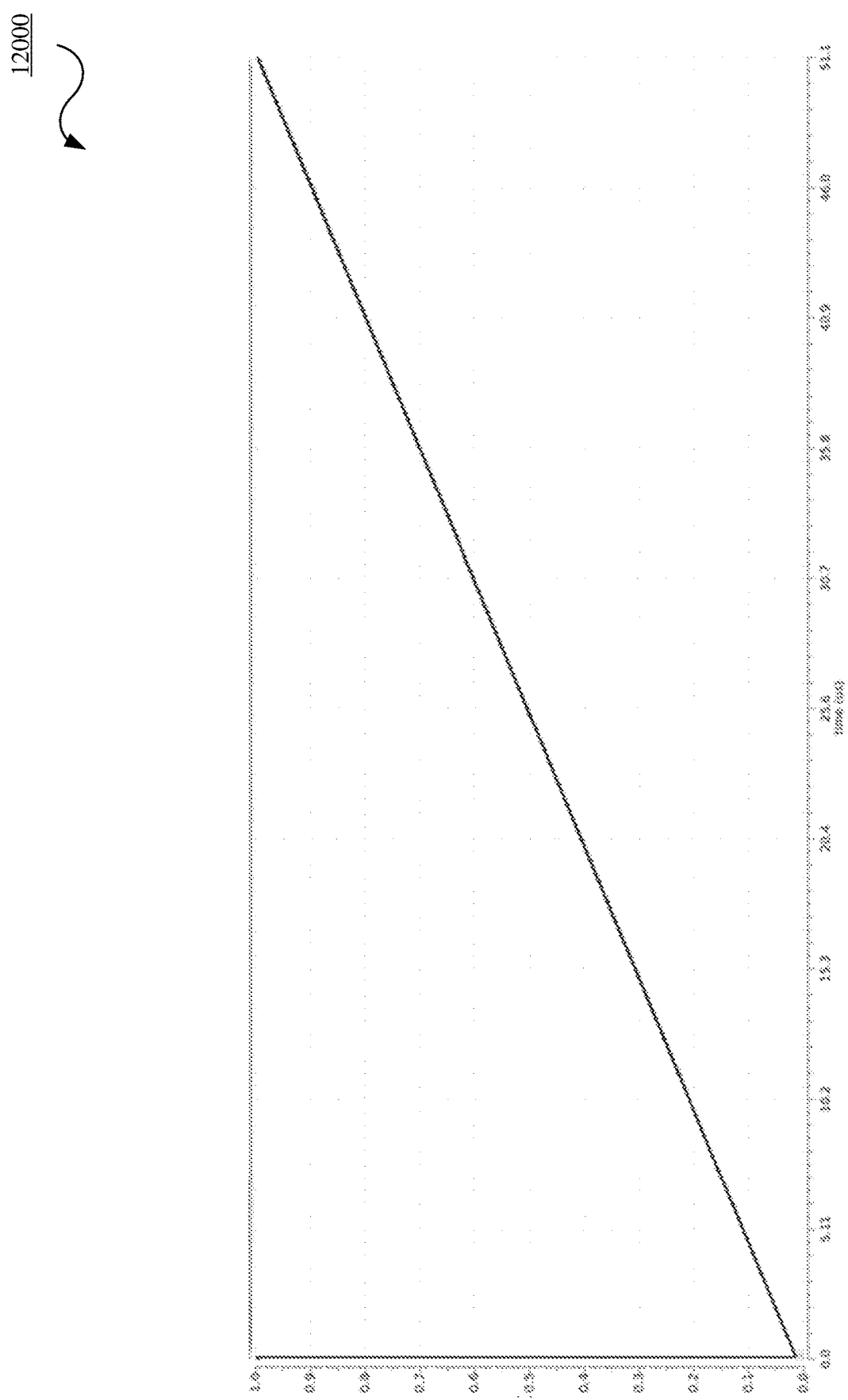
FIG. 12 is a graph of a transfer function of a digitally DAC in accordance with embodiments of this disclosure.
Figure 13:
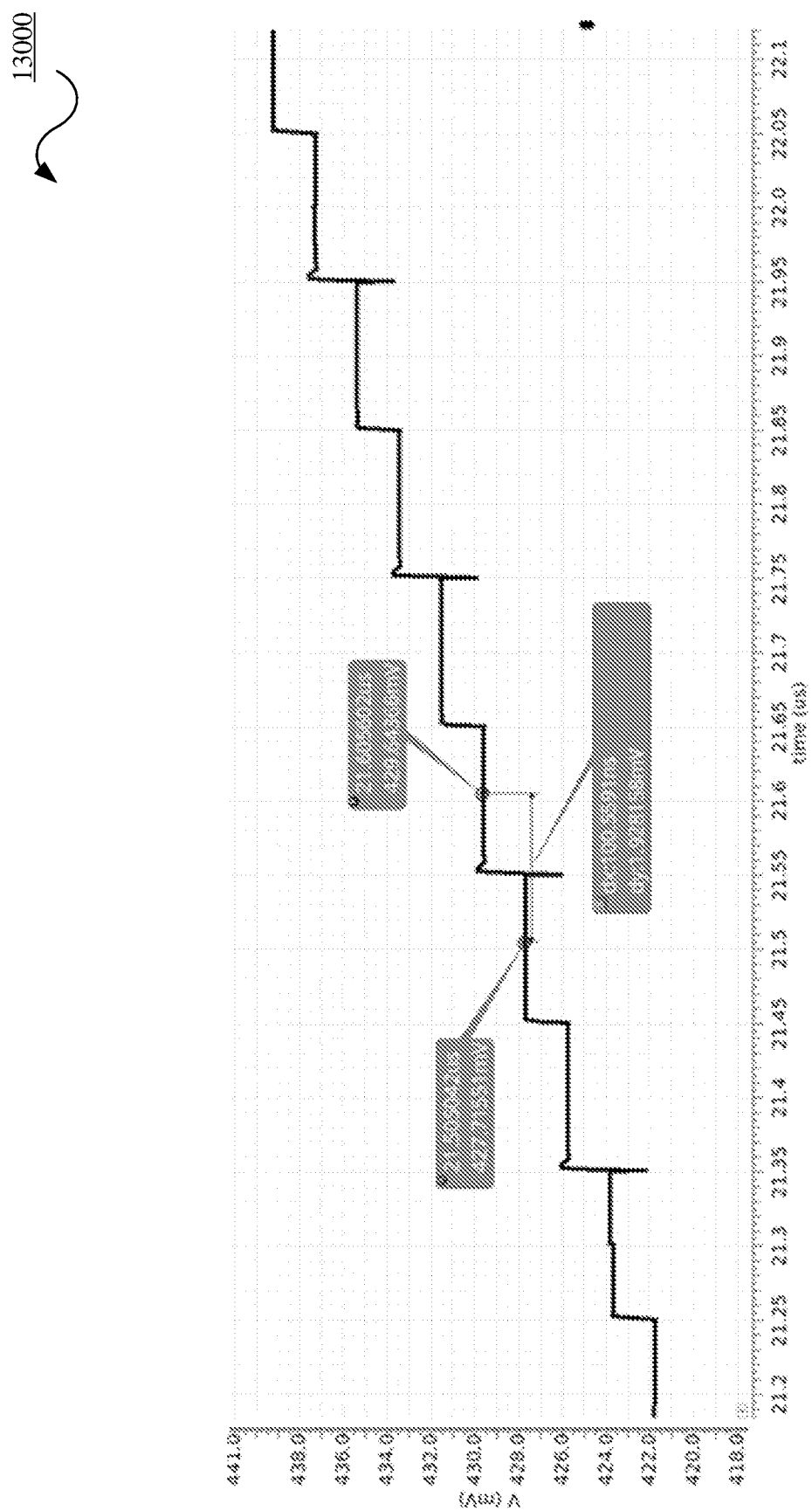
FIG. 13 is a zoomed graph of a transfer function of a digitally DAC in accordance with embodiments of this disclosure.
Figure 14:
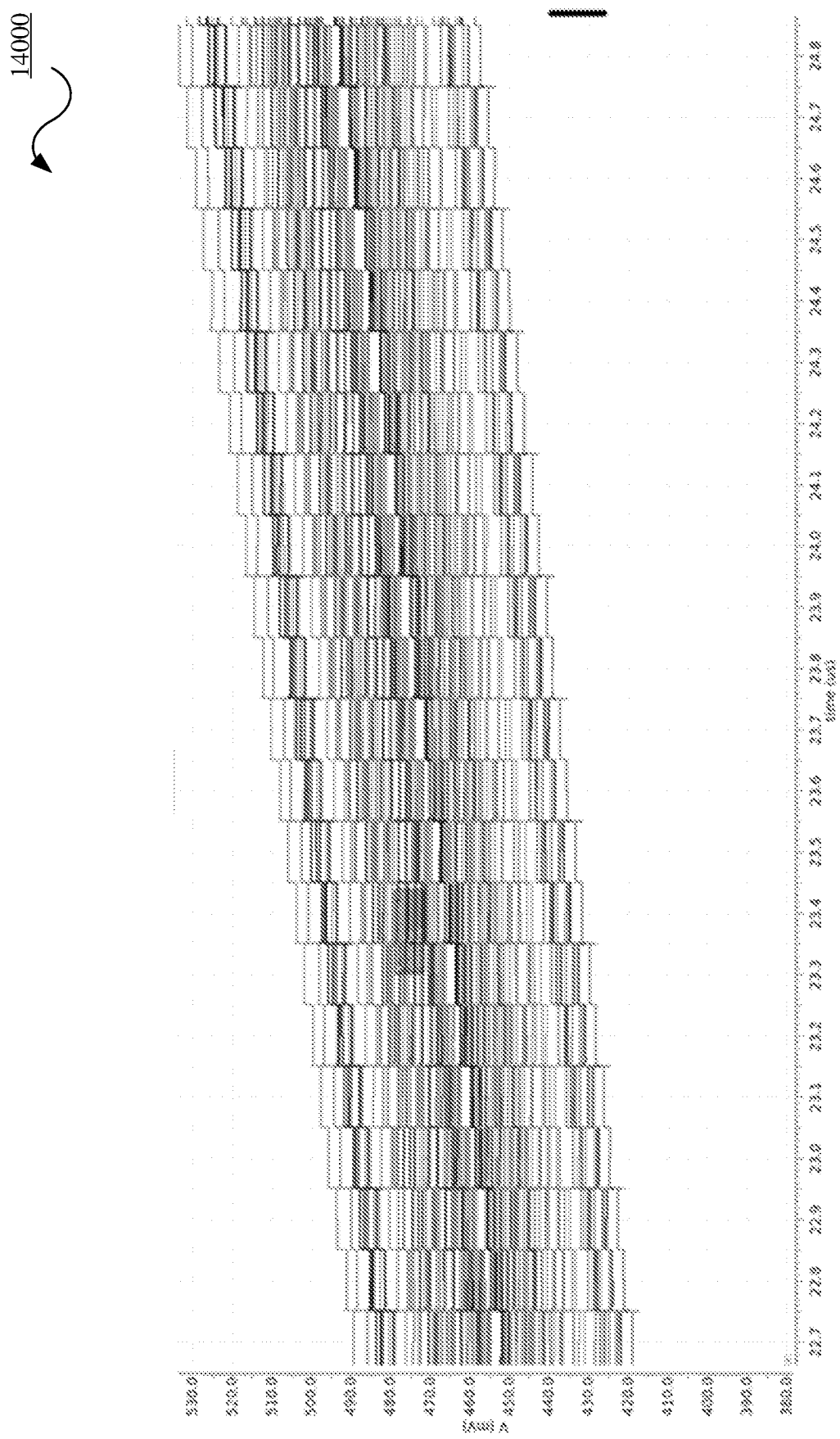
FIG. 14 is a zoomed graph of a transfer function of a digitally DAC showing multiple Monte Carlo simulations in accordance with embodiments of this disclosure.

FIG. 12 is a graph 12000 of a transfer function of a digital enhanced DAC in accordance with embodiments of this disclosure. FIG. 13 is a zoomed graph 13000 of a portion of the graph 12000. The zoomed graph 13000 shows that the step size or resolution is approximately 1.928 (the slope). That is, the step size is approximately ½ the step size of the DAC without the digital enhancement logic. FIG. 14 is a zoomed graph 14000 of a transfer function of a digital enhanced DAC showing multiple Monte Carlo simulations in accordance with embodiments of this disclosure. As shown, the step size is consistently ½ that of a DAC without the digital enhancement circuit.

Figure 15:
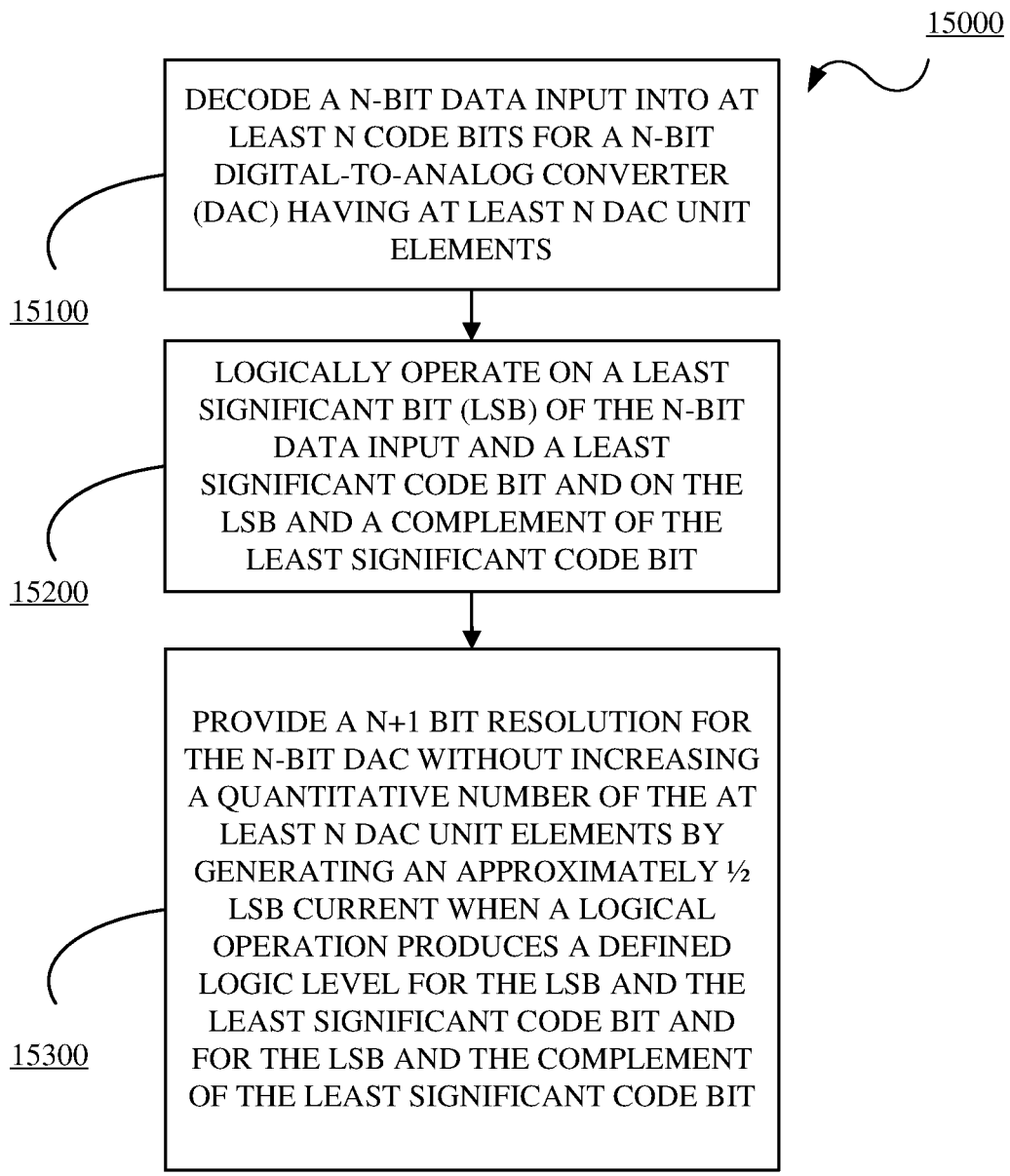
FIG. 15 is a flowchart of an example technique for digitally enhancing a DAC resolution in accordance with embodiments of this disclosure.

FIG. 15 is a flowchart of an example method 15000 for digitally enhancing a DAC resolution in accordance with embodiments of this disclosure. The method 15000 includes decoding 15100 a N-bit data input into at least N code bits for a N-bit digital-to-analog converter (DAC) having at least N DAC unit elements; logically operating 15200 on a least significant bit (LSB) of the N-bit data input and a least significant code bit and on the LSB and a complement of the least significant code bit; and providing 15300 a N+1 bit resolution for the N-bit DAC without increasing a quantitative number the at least N DAC unit elements by generating an approximately ½ LSB current when a logical operation produces a defined logic level for the LSB and the least significant code bit and for the LSB and the complement of the least significant code bit. The method 15000 can be implemented by the DAC 2000 of FIG. 2, the DAC 4000 of FIG. 4, the DAC 6000 of FIG. 6, the digital enhancement circuit 7000 and the current steering unit cell 7100 of FIG. 7, the digital enhancement circuit 8000 and the resistor based DAC unit cell 8100 8000 of FIG. 8, and the digital enhancement circuit 9000 and the switched capacitor based DAC unit cell 9100 of FIG. 9, as appropriate and applicable.

The method 15000 includes decoding 15100 a N-bit data input into at least N code bits for a N-bit digital-to-analog converter (DAC) having at least N DAC unit elements. A N-bit DAC has a N-bit resolution. An N-bit input data is decoded into code bits using a decoder. The number of code bits generated is based on the type of DAC and decoder. The DAC and decoder could be a binary-to-thermometer DAC and decoder, a binary weighted DAC and decoder, and the like.

The method 15000 includes logically operating 15200 on a least significant bit (LSB) of the N-bit data input and a least significant code bit and on the LSB and a complement of the least significant code bit. A digital circuit operates on the least significant bit of the N-bit input data and the code bit. The logical operation can be a logical OR function or equivalents thereof.

The method 15000 includes providing 15300 a N+1 bit resolution for the N-bit DAC without increasing a quantitative number of the at least N DAC unit elements by generating an approximately ½ LSB current when a logical operation produces a defined logic level for the LSB and the least significant code bit and for the LSB and the complement of the least significant code bit. The N-bit DAC has a N+1 bit resolution when the LSB of the N-bit input data is a defined logic level. In implementations, the defined logic level is logic high.

Figure 16:
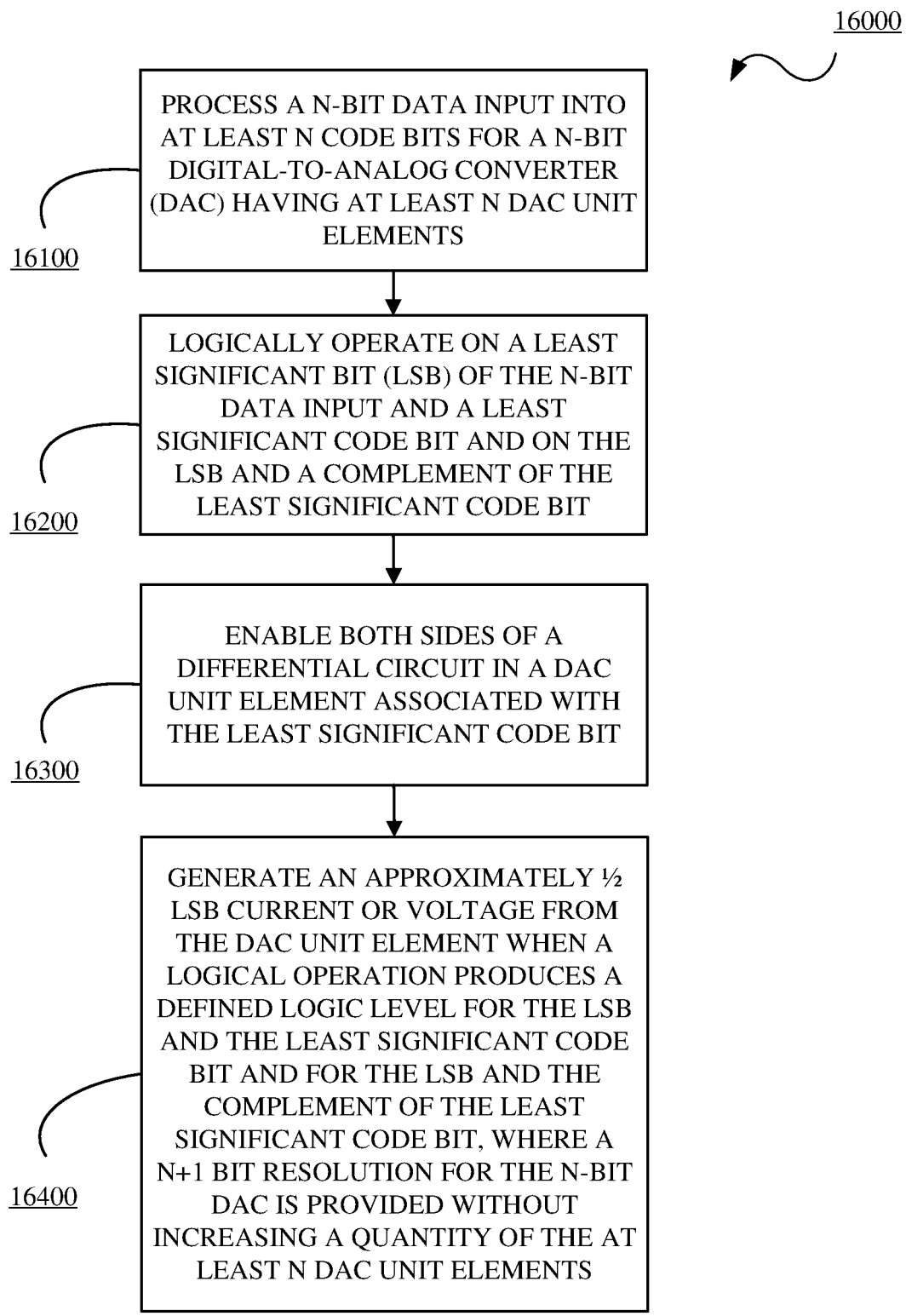
FIG. 16 is a flowchart of an example technique for digitally enhancing a DAC resolution in accordance with embodiments of this disclosure.

FIG. 16 is a flowchart of an example method 16000 for digitally enhancing a DAC resolution in accordance with embodiments of this disclosure. The method 16000 includes processing 16100 a N-bit data input into at least N code bits for a N-bit digital-to-analog converter (DAC) having at least N DAC unit elements; logically operating 16200 on a least significant bit (LSB) of the N-bit data input and a least significant code bit and on the LSB and a complement of the least significant code bit; enabling 16300 both sides of a differential circuit in a DAC unit element associated with the least significant code bit; and generating 16400 an approximately ½ LSB current or voltage from the DAC unit element when a logical operation produces a defined logic level for the LSB and the least significant code bit and for the LSB and the complement of the least significant code bit, where a N+1 bit resolution for the N-bit DAC is provided without increasing a quantity of the at least N DAC unit elements. The method 16000 can be implemented by the DAC 2000 of FIG. 2, the DAC 4000 of FIG. 4, the DAC 6000 of FIG. 6, the digital enhancement circuit 7000 and the current steering unit cell 7100 of FIG. 7, the digital enhancement circuit 8000 and the resistor based DAC unit cell 8100 8000 of FIG. 8, and the digital enhancement circuit 9000 and the switched capacitor based DAC unit cell 9100 of FIG. 9, as appropriate and applicable.

The method 16000 includes processing 16100 a N-bit data input into at least N code bits for a N-bit digital-to-analog converter (DAC) having at least N DAC unit elements. A N-bit DAC has a N-bit resolution. An N-bit input data is decoded into code bits using a decoder. The number of code bits generated is based on the type of DAC and decoder. The DAC and decoder could be a binary-to-thermometer DAC and decoder, a binary weighted DAC and decoder, and the like. A DAC unit element provides a unit current or voltage if enabled by an associated code bit.

The method 16000 includes logically operating 16200 on a least significant bit (LSB) of the N-bit data input and a least significant code bit and on the LSB and a complement of the least significant code bit. A digital circuit operates on the least significant bit of the N-bit input data and the code bit. The logical operation can be a logical OR function or equivalents thereof. The method 16000 includes enabling 16300 both sides of a differential circuit in a DAC unit element associated with the least significant code bit. Each DAC unit element includes a differential circuit for generating a unit current or voltage. The DAC unit element can be implemented as described herein.

The method 16000 includes generating 16400 an approximately ½ LSB current or voltage from the DAC unit element when a logical operation produces a defined logic level for the LSB and the least significant code bit and for the LSB and the complement of the least significant code bit, where a N+1 bit resolution for the N-bit DAC is provided without increasing a quantity of the at least N DAC unit elements. The N-bit DAC has a N+1 bit resolution when the LSB of the N-bit input data is a defined logic level. In implementations, the defined logic level is logic high.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A digital-to-analog converter (DAC) comprising:
   a decoder circuit configured to convert a N-bit input data to at least N code bits; and
   a digital enhancement circuit connected to the decoder circuit, the digital enhancement circuit configured to
      logically operate on a least significant bit (LSB) of the N-bit input data;
      control a least significant DAC unit of at least N DAC units;
      output a factored nominal current or voltage based on the control of the least significant DAC unit and a logical operation, wherein the logical operation outputs a specific logic level based on the LSB; and
      output a nominal current or voltage, based on the control of the least significant DAC unit, absent output of the specific logic level from the logical operation, wherein a resolution of the DAC with the at least N DAC units is N+1 bits.

2. The DAC of claim 1, wherein the digital enhancement circuit is configured to logically operate on the LSB and a least significant code bit and to logically operate on the LSB and a complement of the least significant code bit.

3. The DAC of claim 1, wherein the N+1 bit resolution is provided when the logical operation outputs the specific logic level for the LSB and a least significant code bit and a same specific logic level for the LSB and the complement of the least significant code bit.

4. The DAC of claim 1, wherein the factored nominal current or voltage is approximately a ½ nominal current or voltage.

5. The DAC of claim 1, wherein each DAC unit element is a differential circuit and each side of the differential circuit of the least significant DAC unit element is turned on when the logical operation outputs the specific logic level for the LSB.

6. The DAC of claim 1, wherein the digital enhancement circuit comprises
   a first logical OR gate configured to operate on the LSB and a least significant code bit; and
   a second logical OR gate configured to operate on the LSB and a complement of the least significant code bit,
   wherein the N+1 bit resolution is provided when the first logical OR gate outputs the specific logic level and the second logical OR gate outputs the specific logic level.

7. The DAC of claim 6, wherein an output of the first logical OR gate is connected to one side of a differential circuit in the least significant DAC unit element and an output of the second logical OR gate is connected to a remaining side of the differential circuit in the least significant DAC unit element, and wherein the N+1 bit resolution is provided when the one side of the differential circuit and the remaining side of the differential circuit in the least significant DAC unit element are turned on.

8. A method for digitally enhancing digital-to-analog converter (DAC) resolution, the method comprising:
- decoding a N-bit input data into at least N code bits for a N-bit DAC having at least N DAC unit elements;
- logically operating on a least significant bit (LSB) of the N-bit input data;
- controlling a least significant DAC unit of at least N DAC units;
- outputting a factored nominal current or voltage based on the control of the least significant DAC unit and a logical operation, wherein the logical operation outputs a specific logic level based on the LSB; and
- outputting a nominal current or voltage, based on the control of the least significant DAC unit, absent output of the specific logic level from the logical operation,
- wherein a resolution of the DAC with the at least N DAC units is N+1 bits.

9. The method of claim 8, wherein the logically operating operates on the LSB and a least significant code bit, and on the LSB and a complement of the least significant code bit.

10. The method of claim 8, wherein the N+1 bit resolution is provided when the logical operation outputs the specific logic level for the LSB and a least significant code bit and outputs a same specific logic level for the LSB and the complement of the least significant code bit.

11. The method of claim 8, wherein each DAC unit element includes a differential circuit, the method comprises
- enabling both sides of the differential circuit in the least significant DAC unit element using a logical operation output of the LSB and the least significant code bit and a logical operation output of the LSB and the complement of the least significant code bit.

12. The method of claim 8, wherein the logically operating comprises
- logically ORing the LSB and a least significant code bit to generate a first logical output; and
- logically ORing the LSB and a complement of the least significant code bit to generate a second logical output;
- wherein the N+1 bit resolution is provided when the first logical output and the second logical output are the specific logic level.

13. The method of claim 12, wherein each DAC unit element includes a differential circuit, the method comprises
- enabling one side of the differential circuit in the least significant DAC unit element when the first logical output is the specific logic level; and
- enabling another side of the differential circuit in the least significant DAC unit element when the second logical output is the specific logic level.

14. The method of claim 12, wherein each DAC unit element includes a differential circuit, the method comprises
- connecting the first logical output to one side of the differential circuit in the least significant DAC unit element; and
- connecting the second logical output to a remaining side of the differential circuit in the least significant DAC unit element,
- wherein the N+1 bit resolution is provided when the one side of a differential circuit and the remaining side of the differential circuit in the least significant DAC unit element are turned on.

15. The method of claim 8, wherein the factored nominal current or voltage is approximately a ½ nominal current or voltage.

16. A digital-to-analog converter (DAC) comprising:
- a digital coding section configured to convert a N-bit input data to at least N code bits;
- a digital control circuit connected to the digital coding section, the digital coding section configured to
  - logically operate on a least significant bit (LSB) of the N-bit data;
  - control a least significant DAC unit cell of at least N DAC unit cells;
  - output less than a unit current or voltage when the LSB is a logic high; and
  - output a unit current or voltage when the LSB is a logic low,
- wherein a N+1 bit resolution is provided for the DAC.

17. The DAC of claim 16, wherein the digital control circuit is configured to logically operate on the LSB and a least significant code bit and to logically operate on the LSB and a complement of the least significant code bit.

18. The DAC of claim 16, wherein the N+1 bit resolution is provided when the logical operation outputs a logic level high for the LSB and the least significant code bit and outputs a logic high for the LSB and the complement of the least significant code bit.

19. The DAC of claim 16, wherein the less than a unit current or voltage is approximately a ½ unit current or voltage.

20. The DAC of claim 16, wherein each DAC unit cell is a differential circuit and each side of the differential circuit of the least significant DAC unit cell is turned on when the LSB is a logic high.

* * * * *